US008995489B2

(12) United States Patent
Hara (10) Patent No.: US 8,995,489 B2
(45) Date of Patent: Mar. 31, 2015

(54) SEMICONDUCTOR STACK AND VERTICAL CAVITY SURFACE EMITTING LASER

(71) Applicant: Kei Hara, Tokyo (JP)

(72) Inventor: Kei Hara, Tokyo (JP)

(73) Assignee: Ricoh Company, Ltd., Tokyo (JP)

(*) Notice: Subject to any disclaimer, the term of this patent is extended or adjusted under 35 U.S.C. 154(b) by 29 days.

(21) Appl. No.: 13/790,025

(22) Filed: Mar. 8, 2013

(65) Prior Publication Data

US 2013/0243024 A1 Sep. 19, 2013

(30) Foreign Application Priority Data

Mar. 13, 2012 (JP) .................. 2012-056196
Jan. 17, 2013 (JP) .................. 2013-006259

(51) Int. Cl.
*H01S 5/183* (2006.01)
*H01S 5/343* (2006.01)
*H01S 5/32* (2006.01)
(Continued)

(52) U.S. Cl.
CPC ............ *H01S 5/343* (2013.01); *H01S 5/18383* (2013.01); *H01S 5/3202* (2013.01); *H01S 5/34326* (2013.01); *H01S 5/3434* (2013.01); *H01S 5/041* (2013.01); *H01S 5/14* (2013.01); *H01S 5/18358* (2013.01)
USPC ...................................................... 372/43.01

(58) Field of Classification Search
CPC . H01S 5/183; H01S 5/18358; H01S 5/18383; H01S 5/18397
See application file for complete search history.

(56) References Cited

U.S. PATENT DOCUMENTS 5,023,944 A * 6/1991 Bradley ...................... 359/107
5,461,637 A 10/1995 Mooradian et al.
5,991,318 A 11/1999 Caprara et al.
(Continued)

FOREIGN PATENT DOCUMENTS

JP  2000-174329  6/2000
JP  2002-523889  7/2002
(Continued)

OTHER PUBLICATIONS

Y.H. Chang et al., IEEE Journal of Lightwave Technology, vol. 22, No. 12, 2004, p. 2828-2833.
(Continued)

*Primary Examiner* — Julio J Maldonado
*Assistant Examiner* — Joshua King
(74) *Attorney, Agent, or Firm* — Cooper & Dunham LLP (57) ABSTRACT

A semiconductor stack includes a semiconductor DBR (Distributed Bragg Reflector) formed on a substrate, and a resonator formed on the semiconductor DBR laminating wide-band semiconductor layers and active layers alternately. Each of the active layers includes MQWs (Multiple Quantum Wells) and two spacer layers formed one on each surface of the MQWs. The MQWs are formed by laminating barrier layers and quantum well layers alternately. There are n layers of the wide-band semiconductor layer formed, and a band gap $Eg_m$ of an m-th wide-band semiconductor layer counting from the substrate and a band gap $Eg_{m-1}$ of an m−1-th wide-band semiconductor layer counting from the substrate satisfy $Eg_{m-1} < Eg_m$ where n and m are integers greater than or equal to 2, and $1 < m \leq n$.

9 Claims, 7 Drawing Sheets

(51) Int. Cl.
*H01S 5/04* (2006.01)
*H01S 5/14* (2006.01)

(56) References Cited

U.S. PATENT DOCUMENTS

| | | | |
|---|---|---|---|
| 6,285,702 B1 | 9/2001 | Caprara et al. | |
| 6,327,293 B1 * | 12/2001 | Salokatve et al. | 372/96 |
| 7,502,401 B2 * | 3/2009 | Miller et al. | 372/50.124 |
| 7,693,204 B2 | 4/2010 | Sato et al. | |
| 7,991,033 B2 | 8/2011 | Hara et al. | |
| 8,089,498 B2 | 1/2012 | Sato et al. | |
| 2007/0280322 A1 * | 12/2007 | Sato et al. | 372/50.11 |
| 2008/0212636 A1 * | 9/2008 | Sato et al. | 372/50.11 |
| 2009/0213892 A1 * | 8/2009 | Onishi | 372/50.11 |
| 2009/0296768 A1 * | 12/2009 | Hara et al. | 372/50.124 |
| 2010/0322669 A1 * | 12/2010 | Takeuchi et al. | 399/221 |

FOREIGN PATENT DOCUMENTS

| | | | | |
|---|---|---|---|---|
| JP | 4837830 | 12/2011 | | |
| WO | WO 2009109166 A2 * | 9/2009 | | H01S 5/183 |

OTHER PUBLICATIONS

J.W.Matthews and A.E.Blakeslee: J.Cryst.Growth 27(1974) pp. 118-125.

T. Schwarzbäch et al., Proc. of SPIE vol. 7919 79190B pp. 1-10, (2011).

U. Keller et al., Physics Report 429(2006) pp. 67-120.

A. Sirbu et al., Proc. of SPIE vol. 7919 791903 pp. 1-11, (2011).

M. Kuznetsov et al., IEEE Photonics Technology Letters, vol. 9, No. 8 (1997) pp. 1063-1065.

* cited by examiner

SEMICONDUCTOR STACK AND VERTICAL CAVITY SURFACE EMITTING LASER

BACKGROUND OF THE INVENTION

1. Field of the Invention

The disclosures herein generally relate to a semiconductor stack and a vertical cavity surface emitting laser.

2. Description of the Related Art

A solid state laser such as Nd:GdVO4, Nd:YAG, etc., has a limited wavelength, whereas a semiconductor laser can emit various wavelengths of laser light because it is relatively easy to adjust the composition of active materials. Therefore, it is expected to be applied in fields requiring a high output laser. A vertical cavity surface emitting laser (VCSEL) has, in particular, a superior characteristic of wavelength controllability without suffering from mode hopping.

Such a semiconductor laser emits light of a predetermined wavelength at a specific band gap by current injection into an active layer or carrier injection with optical excitation. To implement carrier injection effectively, a quantum well active layer is widely used in an active layer structure. Moreover, to enable a higher output, a multiple quantum well (MQW) structure is generally used in which multiple quantum well layers are separated by barrier layers.

For example, in Non-patent document 1 discloses a structure in which three 8 nm-thick quantum well layers formed with GaInAsP are separated with 10 nm-thick barrier layers formed with GaInP.

Also, to achieve a higher output with a VCSEL, there are several requirements to be satisfied such as effective carrier confinement, improved gain, and a superior heat radiation characteristic for heat generated at active layers.

Patent document 1 discloses a structure which has improved carrier confinement effect by forming a layer with a broader band gap outside of barrier layers between which a quantum well layer is laminated, which is described as a carrier leak prevention layer.

Patent document 2 discloses an external reflecting mirror VCSEL using optical excitation to achieve a higher output. Specifically, in a structure disclosed in Patent document 2, GaInP layers with thickness of $\lambda/2$ ($\lambda$: an oscillating wavelength) are provided on both surfaces of a resonator to improve carrier confinement effect. Moreover, in the above structure, a GaInAs material having compressive strain is used for a quantum well layer, and a number of layers formed with a Ga(In)PAs material having tensile strain are used to compensate for the compressive strain.

However, the structure disclosed in Patent document 1 has a small band gap difference, with which it cannot be expected to achieve a higher output. Also, as the oscillation wavelength range of the semiconductor laser is 780 nm, Al0.2Ga0.8As is used for high refractive index layers at an upper semiconductor DBR (Distributed Bragg Reflector) and a lower DBR, and Al0.4Ga0.6As is used in upper cladding layers and lower cladding layers. However, it is not preferable to use these materials in a semiconductor laser if targeting a higher output, because these materials have low thermal conductivity.

Also, structures disclosed in Patent documents 2 and 3 use a GaInP layer or a layer formed with a Ga(In)PAs material. However, again, it is not preferable to use GaInP or a Ga(In)PAs material in a semiconductor laser if targeting a higher output, because these materials have low thermal conductivity. Moreover, when producing the structure disclosed in Patent document 2, if a Ga(In)PAs material is grown on GaAs, or GaAs is grown on a Ga(In)PAs material, it is necessary to change growth atmosphere from As atmosphere to P/As mixed atmosphere, or from P/As mixed atmosphere to As atmosphere. In such cases, As or P atoms tend to become detached, which generates lattice defects at the interface, increases absorption of laser light, and prevents a higher output.

Non-patent document 3 discloses VCSELs with various structures for optical excitation. As an example, a structure is disclosed in which five layers are laminated in which each of the five layers includes a pair of 2QW quantum well layers and a carrier block layer in-between the pair of 2QW quantum well layers. However, it cannot be expected to achieve effective carrier confinement effect because heights of barrier layers are all the same. Also, the 2QW quantum well layers are evenly disposed, in which an active layer structure for optical excitation cannot be recognized. Another feature is that the number of quantum well layers in an MQW active layer is increased when moving towards the surface to prevent carrier overflow at active layers close to the surface. However, it is not a suitable structure for a higher output because, again, heights of barrier layers in a carrier block layer between MQMs are all the same.

Also, Non-patent document 4 discloses a structure in which the number of quantum wells is increased when moving towards the surface. Again, heights of barrier layers in a carrier block layer are all the same.

Also, Non-patent document 5 discloses a structure of an optical-excitation VCSEL wafer using a red-light emitting material. In general, it is difficult to use a red-light emitting AlGaInP material to achieve a higher output because it cannot obtain a sufficient amount of band offset with a barrier material. Here, although a number of quantum wells are laminated to achieve a certain level of output, it is difficult to achieve a higher output because low carrier confinement effect inherent to the structure remains unchanged.

Also, Non-patent document 6 discloses a structure in which a reflection prevent layer, also used as a carrier block layer, is formed with Al0.3Ga0.7As at the outermost surface. However, there is a high likelihood that a number of carriers susceptible to non-light-emitting recombination are generated, because there is no carrier block layer between an active layer and a reflecting mirror, the active layer is attached to a low refractive index layer Al0.8Ga0.2As in the reflecting mirror, and layers with a high Al composition include much oxygen. Also, the structure described in Non-patent document 6 has low thermal conductivity because Al0.8Ga0.2As is used in the low refractive index layer in the reflecting mirror as above, with which a higher output cannot be expected due to low thermal conductivity.

Also, in Patent document 4, although there is a description on a carrier block layer, heights of barriers are all the same, and carrier density distribution relevant to optical excitation is not taken into account at all.

Patent Documents:
1. Japanese Laid-open Patent Application No. 2000-174329
2. Japanese Laid-open Patent Application (Translation of PCT Application) No. 2002-523889
3. Japanese Patent No. 4837830
4. U.S. Pat. No. 5,461,637

Non-Patent Documents:
1. IEEE JOURNAL OF LIGHTWAVE TECHNOLOGY, VOL 22, No. 12, 2004, p 2828-2833
2. J. W. Matthews and A. E. Blakslee: J. Cryst. Growth 27 (1974) 118
3. Proc. of SPIE Vol. 7919 791903 p 1-11
4. Physics Report 429 (2006) p 67-120
5. Proc. of SPIE Vol. 7919 791908 p 1-10
6. IEEE. Photonic Technology Letters, Vol. 9, No. 8 (1997) p 1063-1065

SUMMARY OF THE INVENTION

It is a general object of at least one embodiment of the present invention to provide a semiconductor stack and a vertical cavity surface emitting laser that substantially obviate one or more problems caused by the limitations and disadvantages of the related art, and specifically, to provide a semiconductor stack and a vertical cavity surface emitting laser with a high carrier confinement effect, a superior heat radiation characteristic, and high gain.

According to at least one embodiment of the present invention, a semiconductor stack includes a semiconductor DBR (Distributed Bragg Reflector) formed on a substrate, and a resonator formed on the semiconductor DBR, formed by laminating wide-band semiconductor layers and active layers alternately. Each of the active layers includes MQWs (Multiple Quantum Wells) and two spacer layers formed one on each surface of the MQWs. The MQWs are formed by laminating barrier layers and quantum well layers alternately. There are n layers of the wide-band semiconductor layers formed, and a band gap $Eg_m$ of an m-th wide-band semiconductor layer counting from the substrate and a band gap $Eg_{m-1}$ of an m-1-th wide-band semiconductor layer counting from the substrate satisfy $Eg_{m-1} < Eg_m$ where n and m are integers greater than or equal to 2, and $1 < m \leq n$.

According to at least one embodiment of the present invention, it is possible to provide a semiconductor stack and a vertical cavity surface emitting laser with a high carrier confinement effect, a superior heat radiation characteristic, and high gain.

BRIEF DESCRIPTION OF THE DRAWINGS

Other objects and further features of embodiments will be apparent from the following detailed description when read in conjunction with the accompanying drawings.

DESCRIPTION OF THE PREFERRED EMBODIMENTS

In the following, embodiments of the present invention will be described with reference to the accompanying drawings. The same or corresponding elements or parts across the drawings are assigned the same or corresponding numerical code, whose explanation may not be repeated.

First Embodiment

A VCSEL is a kind of semiconductor laser which has superior wavelength controllability because its oscillation wavelength is determined by film thickness of a reflecting mirror and film thickness of a resonator. Emission wavelength is determined by a composition of a quantum well layer in an active layer and film thickness control. Therefore, it is possible to achieve wavelength stability as well as high efficiency, relatively easily.

However, it is necessary to provide a relatively thick reflecting mirror between an active layer and a heat radiating material. Therefore, a VCSEL has an inferior heat radiation characteristic compared to an edge-emitting laser, which may induce temperature rise at the quantum well layers, resulting in characteristic degradation such as a reduced output. Therefore, sufficient care should be taken for materials configuring a reflecting mirror and film thickness when targeting a higher output. Also, care should be taken for a heat radiation characteristic of an active layer to avoid using a material with an inferior heat radiation characteristic unnecessarily.

Figure 1:
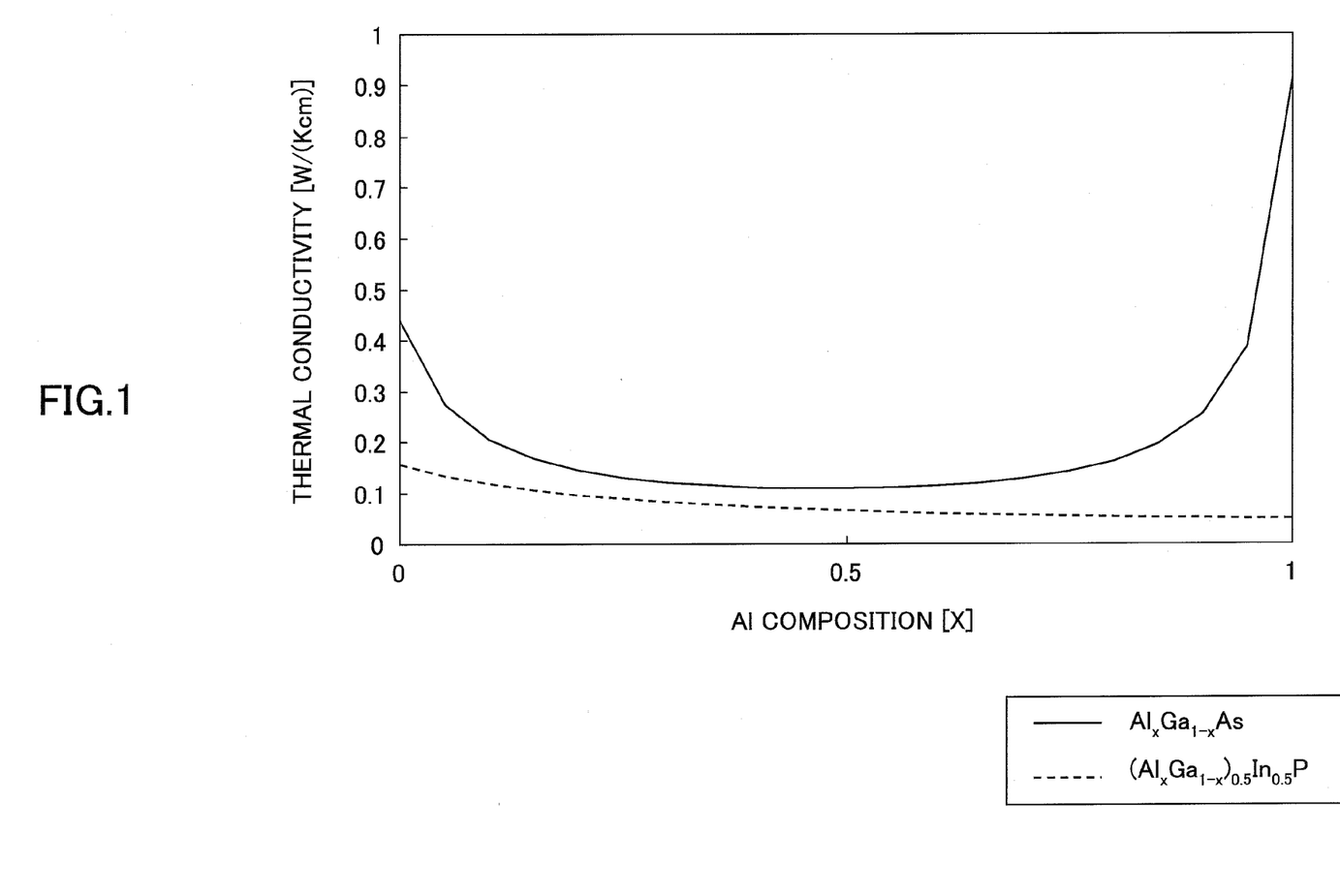
FIG. 1 is a graph illustrating a correlation between Al composition ratio and thermal conductivity in AlGaAs and AlGaInP.

On the other hand, to achieve a higher output, effective carrier confinement should be considered as well as increasing the number of quantum well layers to improve gain. As for a compound semiconductor material used as a carrier block material with which a carrier block layer is formed for carrier confinement, if using an AlGaAs material, it is preferable to use a material with an Al composition of 0.2 to 0.5 because a material with an Al composition close to 0 has a low carrier block effect, and a material with an Al composition close to 1 is oxidized if disposed at the outermost surface. Although it is possible to use an AlGaInP material, the thermal conductivity of an AlGaInP material remains low even if the Al composition is changed as shown in FIG. 1. Therefore, to achieve a higher output with a VCSEL, comprehensive investigation should be made on composition and film thickness of a material to form a VCSEL.

FIG. 1 shows thermal conductivity of an AlGaAs material and an AlGaInP material while Al composition ratio is changed under a lattice matching condition. The AlGaAs material has the lowest thermal conductivity when the Al composition ratio is around 0.5, while the AlGaInP material has lower thermal conductivity with higher Al composition ratio.

Figure 2:
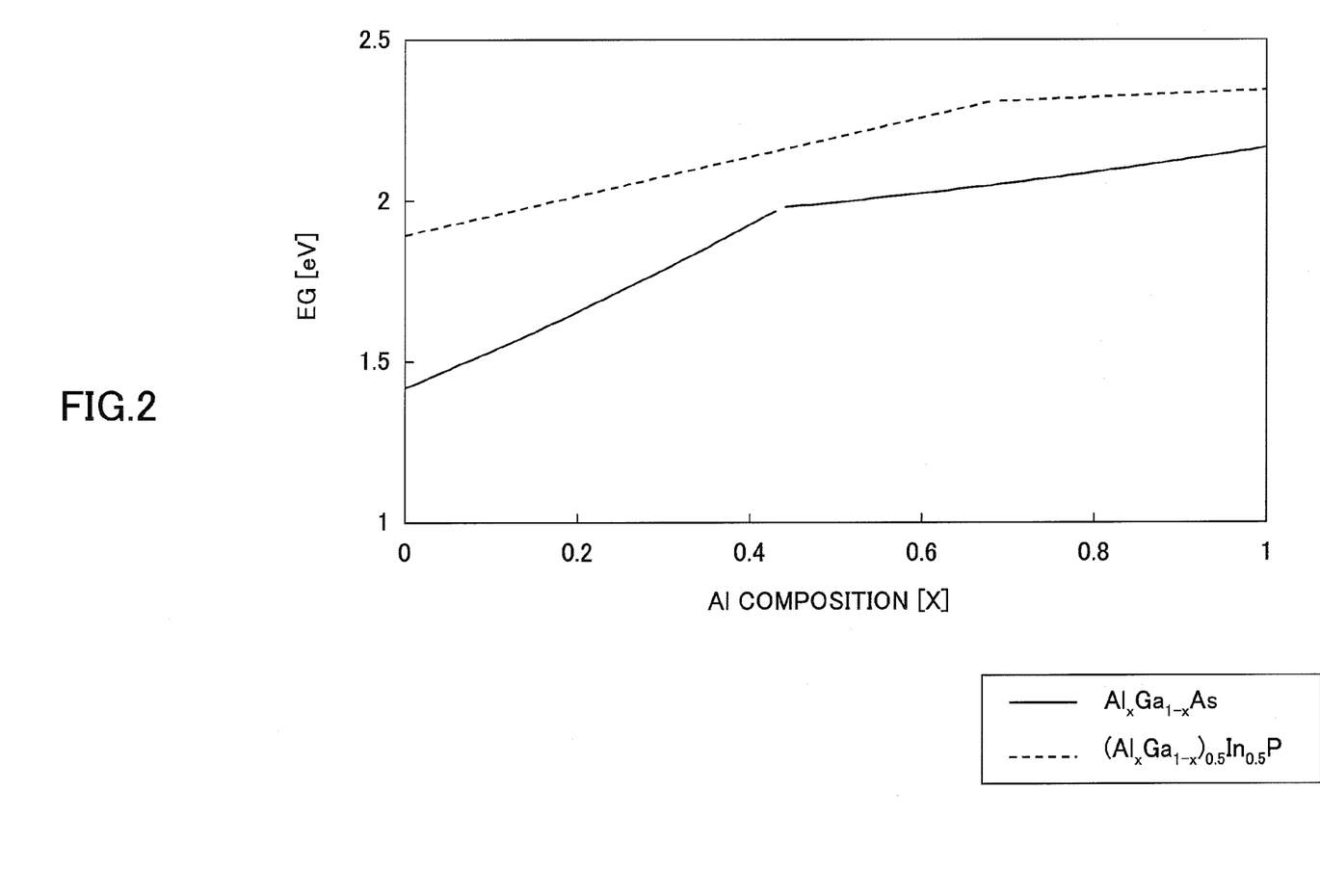
FIG. 2 is a graph illustrating a correlation between Al composition ratio and band gap in AlGaAs and AlGaInP.

Next, FIG. 2 shows band gap of the AlGaAs material and AlGaInP material while Al composition ratio is changed under the lattice matching condition. Both materials have a tendency that the higher the Al composition is, the wider the band gap becomes, which results in higher carrier confinement effect.

(Semiconductor Laminate)

Figure 3:
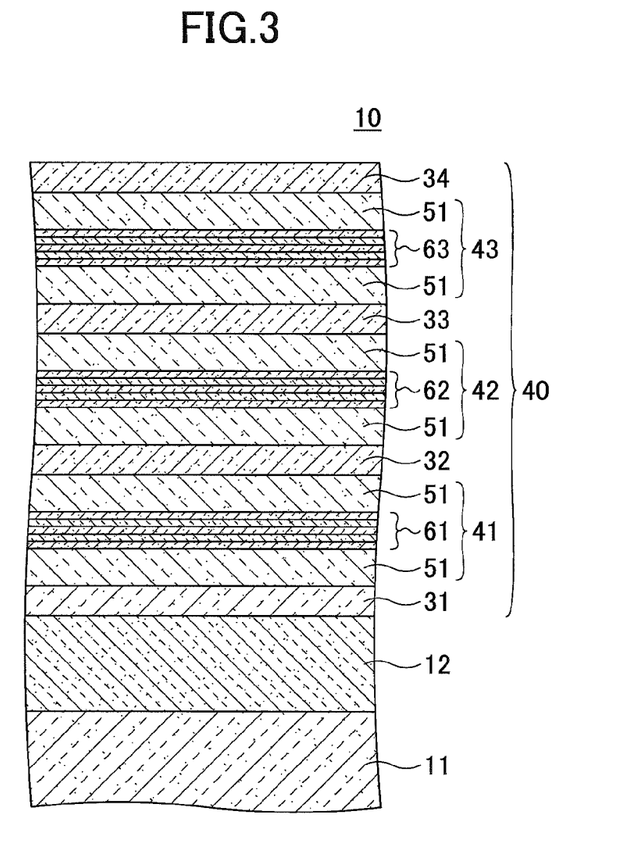
FIG. 3 is a schematic view illustrating a semiconductor stack according to the first embodiment.

Next, a semiconductor stack will be explained according to the present embodiment. FIG. 3 shows a semiconductor stack 10 according to the present embodiment. According to the present embodiment, in the semiconductor stack 10, a GaAs (100) substrate with 15 degrees off toward ((111) direction) is used as a substrate 11, on which 30 pairs of GaAs/AlAs layers are laminated to form a semiconductor DBR 12. On the semiconductor DBR 12, a first carrier block layer 31, a first active layer 41, a second carrier block layer 32, a second active layer 42, a third carrier block layer 33, a third active layer 43, and a fourth carrier block layer 34 are formed in that order. It is noted that in the present embodiment, a region formed with the first carrier block layer 31, the first active layer 41, the second carrier block layer 32, the second active layer 42, the third carrier block layer 33, the third active layer 43, and the fourth carrier block layer 34 may be referred to as a resonator layer 40. Also, in the present embodiment, the first carrier block layer 31, the second carrier block layer 32, the third carrier block layer 33, and the fourth carrier block layer 34 may be referred to as the first wide-band semiconductor layer, the second wide-band semiconductor layer, the third wide-band semiconductor layer, and the fourth wide-band semiconductor layer, respectively, counting from the layer closest to the substrate 11.

Each of the first active layer 41, the second active layer 42, and the third active layer 43 has a structure in which a spacer layer, an MQW layer, and a spacer layer are laminated in that order; namely, the spacer layers are formed on both surfaces of the MQW layer. Specifically, the first active layer 41 has a structure in which the spacer layer 51, the MQW layer 61, and the spacer layer 51 are laminated; namely, the spacer layers are formed on both surfaces of the MQW layer. The second active layer 42 has a structure in which the spacer layer 51, the MQW layer 62, and the spacer layer 51 are laminated; namely, the spacer layers are formed on both surfaces of the MQW layer. The third active layer 43 has a structure in which the spacer layer 51, the MQW layer 63, and the spacer layer 51 are laminated; namely, the spacer layers are formed on both surfaces of the MQW layer. The spacer layers 51 are formed with GaAs, and the MQW layers 61 to 63 include GaInAs/GaAs TQW ($\lambda$=980 nm).

Also, in the present embodiment, the first carrier block layer 31, the second carrier block layer 32, the third carrier block layer 33, and the fourth carrier block layer 34 are formed with an AlGaInPAs material, with a different composition ratio for each layer. Specifically, the first carrier block layer 31 is formed with $(Al_{X1}Ga_{1-X1})_{Y1}In_{1-Y1}P_{Z1}As_{1-Z1}$, the second carrier block layer 32 is formed with $(Al_{X2}Ga_{1-X2})_{Y2}In_{1-Y2}P_{Z2}As_{1-Z2}$, the third carrier block layer 33 is formed with $(Al_{X3}Ga_{1-X3})_{Y3}In_{1-Y3}P_{Z3}As_{1-Z3}$, and the fourth carrier block layer 34 is formed with $(Al_{X4}Ga_{1-X4})_{Y4}In_{1-Y4}P_{Z4}As_{1-Z4}$, where X1<X2<X3<X4, Y1=Y2=Y3=Y4, and Z1=Z2=Z3=Z4.

If such a semiconductor structure is connected with a heat radiation plate (not shown) via the substrate 11, heat generated at the first active layer 41, the second active layer 42, and the third active layer 43 is conducted to the heat radiation plate (not shown) mainly via the semiconductor DBR 12 and the substrate 11. For example, heat generated at the third active layer 43 is mainly conducted through the third carrier block layer 33, the second active layer 42, the second carrier block layer 32, the first active layer 41, the first carrier block layer 31, the semiconductor DBR 12, and the substrate 11. Therefore, the closer an active layer to the surface of the semiconductor stack 10 (the opposing surface to the substrate 11) is, the higher the temperature of the active layer rises and is more likely to generate carrier overflow.

However, in the semiconductor stack 10 in the present embodiment, the first carrier block layer 31, the second carrier block layer 32, the third carrier block layer 33, and the fourth carrier block layer 34 are formed in such compositions where X1<X2<X3<X4, Y1=Y2=Y3=Y4, and Z1=Z2=Z3=Z4 are satisfied. Therefore, band gaps of these carrier block layers satisfy the following relation, Eg1<Eg2<Eg3<Eg4, where Eg1, Eg2, Eg3, and Eg4 are the band gaps of the first carrier block layer 31, the second carrier block layer 32, the third carrier block layer 33, and the fourth carrier block layer 34, respectively. Therefore, the closer a carrier block layer to the surface is, the higher a barrier for the carrier block layer can be made. With this structure, carrier overflow can be avoided in all of the first active layer 41, the second active layer 42, and the third active layer 43, with which effective carrier injection can be done if carrier injection is done by optical excitation from the surface.

It is noted that, although there are three active layers and four carrier block layers in the above example, the number of carrier block layers can be any plural number. Therefore, the above example can be generalized to a case where n layers of carrier block layers (so there exists the n-th wide-band semiconductor layer) are formed. In this case, assuming the m-th carrier block layer (the m-th layer from the substrate 11, or the m-th wide-band semiconductor layer) has an Al composition ratio of $X_m$ and a band gap of $E_{gm}$, then $X_{m-1}<X_m$ and $Eg_{m-1}<Eg_m$ are satisfied where 2≤m≤n. Here, it is assumed that the composition ratio of In, P, As in all carrier block layers are the same. Namely, a composition of the m-th carrier block layer (the mth layer from the substrate 11) is $(Al_{Xm}Ga_{1-Xm})_{Ym}In_{1-Ym}P_{Zm}As_{1-Zm}$, where $Y_m$ and $Z_m$ are prescribed fixed values, respectively. Also, m, n are integers greater than or equal to 2, and $Y_m$ can take any value as long as the conditions of the band gaps above are satisfied.

(External-Reflecting-Mirror-Type VCSEL)

Next, with reference to FIG. 4, an external-reflecting-mirror-type VCSEL using the semiconductor stack 10 will be explained. This external-reflecting-mirror-type VCSEL has the semiconductor stack 10, with a structure shown in FIG. 3, disposed on a heat radiation substrate 70, and an external reflecting mirror 80 is provided over the semiconductor stack 10. The semiconductor stack 10 is disposed on the heat radiation substrate 70 so that the surface having the resonator layer 40 formed is directed upward to be exposed to light. In addition, a light source for excitation 90 is provided to irradiate light on the semiconductor stack 10. With such an external-reflecting-mirror-type VCSEL, by irradiating light from the light source for excitation 90, light is emitted from the first active layer 41, the second active layer 42, and the third active layer 43 in the resonator layer 40, which is reflected and resonated at the semiconductor DBR 12 and the external reflecting mirror 80, then emitted as laser light in a direction perpendicular to the surface of the substrate 11.

In the present embodiment, the external reflecting mirror 80 is formed to have a lower reflectance than the semiconductor DBR 12 formed in the semiconductor stack 10, and fixed at a prescribed position. The light source for excitation 90 emits laser light with a shorter wavelength than a wavelength corresponding to the band gap of GaAs. The laser light emitted from the light source for excitation 90 generates carriers in the first active layer 41, the second active layer 42, and the third active layer 43, which are recombined in GaInAs/GaAs TQW to emit light. The emitted light is repeatedly reflected between the semiconductor DBR 12 in the semiconductor stack 10 and the external reflecting mirror 80 to be amplified, and is emitted as laser light from the external reflecting mirror 80 which has the lower reflectance than the semiconductor DBR 12.

(Quantum Well)

Next, the MQW layers 61-63 in the first active layer 41, the second active layer 42, and the third active layer 43, respectively, will be explained. The MQW layers 61-63 include GaInAs/GaAs TQW. The MQW layers 61-63 are quantum well layers formed with GaInAs, whose emission wavelength $\lambda$ is about 980 nm. If the thickness of a quantum well layer is 8 nm, lattice strain in $Ga_{0.835}In_{0.165}As$ is about 1.2%. As it is difficult to laminate a number of layers with such relatively large lattice strain, the film thickness usually has to be contained within a prescribed range not to go beyond the critical thickness. However, there is a method to form a film with a film thickness over the critical thickness in which a strain-compensated structure is formed by forming a layer having a reverse strain known as a distorted quantum well layer.

In the present embodiment, the first carrier block layer 31, the second carrier block layer 32, the third carrier block layer 33, and the fourth carrier block layer 34 are formed with an AlGaInPAs material including five kinds of elements. By setting composition ratio of these elements appropriately, it is possible to set an arbitrary band gap and lattice strain. With this structure, a number of layers with lattice strain can be laminated. Specifically, if an AlGaInPAs material is denoted as $(Al_XGa_{1-X})_YIn_{1-Y}P_ZAs_{1-Z}$, the band gap Eg is 2.42 eV and the lattice strain is −0.56% where X=0.6, Y=0.6, Z=1. By laminating layers with the composition ratio to 50 nm, the total amount of strain in the above mentioned TQW structure becomes 0. With this structure, an infinite number of layers can be, theoretically, laminated.

Specifically, if a quantum well layer has compressed strain, a wide-band semiconductor layer is formed to have tensile strain, and if a quantum well layer has tensile strain, a wide-band semiconductor layer is formed to have compressed strain, which reduces the total amount of strain.

(Producing Method)

Next, a method of producing the semiconductor stack will be described according to the present embodiment with reference to FIG. 3 and the others. In the present embodiment, the semiconductor stack is formed by laminating semiconductor layers including three active layers on top of the substrate 11. A crystal growth device to form semiconductor layers may be preferably a MOCVD (Metal Organic Chemical Vapor Deposition) device with respect to mass production. Alternatively, an MBE (Molecular Beam Epitaxy) device may be used. As the substrate 11, a semiconductor substrate, GaAs (100) substrate is used. On top of the substrate 11, the semiconductor DBR 12 is formed by laminating 30.5 pairs of GaAs/AlAs layers (30 GaAs layers, and 31 AlAs layers). The GaAs and AlAs layers are formed to have a film thickness of one-fourth of λ (980 nm) with taking a refraction index into account. As shown in FIG. 1, GaAs and AlGa have relatively high heat conductivity among AlGaAs materials. Also this combination of GaAs and AlGa can maximize a difference of refraction indices, which makes this combination the most preferable when a GaAs substrate is used as the substrate 11.

Next, on top of the semiconductor DBR 12, the first carrier block layer 31 is formed. The first carrier block layer 31 is formed with $(Al_{0.1}Ga_{0.9})_{0.58}In_{0.42}P$ having the thickness of about 20 nm. After that, on top of the first carrier block layer 31, the spacer layer 51 is formed with GaAs, then the MQW layer 61 is formed. The MQW layer 61 is formed with $Ga_{0.83}In_{0.17}As$/GaAs TQW. Here, by making the thickness of a quantum well layer and a barrier layers 8 nm and 20 nm, respectively, emission wavelength can be set to about 980 nm. Next, on top of the MQW layer 61, the spacer layer 51 is formed with GaAs. By laminating the spacer layer 51, the MQW layer 61, and the spacer layer 51, the first active layer 41 is formed. Here, the spacer layer 51 in the first active layer 41 is formed so that the thickness between the center of the first carrier block layer 31 and the center of the second carrier block layer 32 is equivalent to the optical length of 980 nm. The second carrier block layer 32 will be described later.

Next, on top of the first active layer 41, the second carrier block layer 32 is formed. The second carrier block layer 32 is formed with $(Al_{0.4}Ga_{0.6})_{0.58}In_{0.42}P$ having the thickness of about 20 nm. After that, on top of the second carrier block layer 32, the spacer layer 51 is formed with GaAs, then the MQW layer 62 is formed. The MQW layer 62 is formed with $Ga_{0.83}In_{0.17}As$/GaAs TQW. Here, by making the thickness of a quantum well layer and barrier layers 8 nm and 20 nm, respectively, emission wavelength can be set to about 980 nm. Next, on top of the MQW layer 62, the spacer layer 51 is formed with GaAs. By laminating the spacer layer 51, the MQW layer 62, and the spacer layer 51, the second active layer 42 is formed. Here, the spacer layer 51 in the second active layer 42 is formed so that the thickness between the center of the second carrier block layer 32 and the center of the third carrier block layer 33 is equivalent to the optical length of 980 nm. The third carrier block layer 33 will be described later.

Next, on top of the second active layer 42, the third carrier block layer 33 is formed. The third carrier block layer 33 is formed with $(Al_{0.7}Ga_{0.3})_{0.58}In_{0.42}P$ having the thickness of about 20 nm. After that, on top of the third carrier block layer 33, the spacer layer 51 is formed with GaAs, then the MQW layer 63 is formed. The MQW layer 63 is formed with $Ga_{0.83}In_{0.17}As$/GaAs TQW. Here, by making the thickness of a quantum well layer and the barrier layers 8 nm and 20 nm, respectively, emission wavelength can be set to about 980 nm. Next, on top of the MQW layer 63, the spacer layer 51 is formed with GaAs. By laminating the spacer layer 51, the MQW layer 63, and the spacer layer 51, the third active layer 43 is formed. Here, the spacer layer 51 in the third active layer 43 is formed so that the thickness between the center of the third carrier block layer 33 and the center of the fourth carrier block layer 34 is equivalent to the optical length of 980 nm. The fourth carrier block layer 34 will be described later.

Next, on top of the third active layer 43, the fourth carrier block layer 34 is formed. The fourth carrier block layer 34 is formed with Al0.58In0.42P having the thickness of about 20 nm.

It is preferable that the centers of the MQW layers 61, 62, and 63 are positioned at antinodes of a standing wave, respectively.

Incidentally, there are documents or the like in which 0.2 to 0.5 of Al is added in a barrier layer or the spacer layer 51 in a 980-nm-range semiconductor laser to take carrier confinement into account. However, as shown in FIG. 1, an AlGaAs material having such a composition ratio has low thermal conductivity and low heat radiation effect. Therefore, in the present embodiment, a high-thermal-conductivity GaAs material is used for a barrier layer, the spacer layer 51 and the like. Also, to improve the carrier block effect, a carrier block layer is formed with an AlGaInP material or an AlGaInPAs material which have wider band gaps than an AlGaAs material. With these considerations, in the present embodiment, both carrier blocking effect and heat radiation effect are realized. Here, as described above, the first carrier block layer 31, the second carrier block layer 32, the third carrier block layer 33, and the fourth carrier block layer 34 are formed with an AlGaInP material. Alternatively, these layers may be formed with an AlGaInPAs material.

Figure 4:
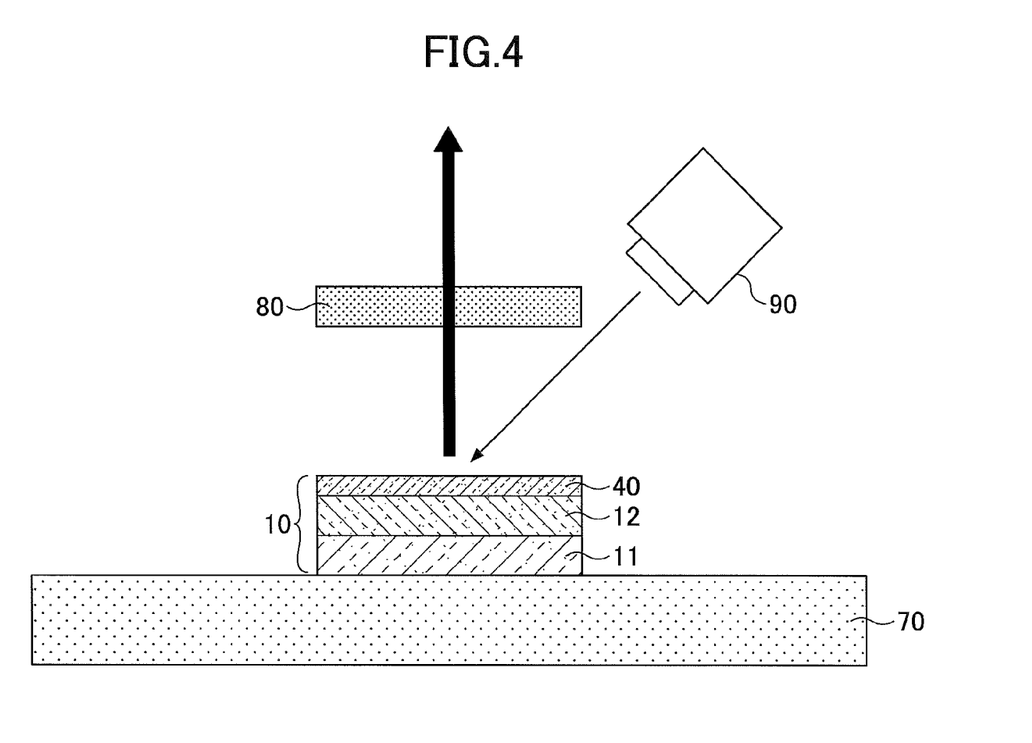
FIG. 4 is a schematic view illustrating a vertical cavity surface emitting laser device according to the first embodiment.

By using the semiconductor stack formed as above, a vertical cavity surface emitting laser is formed as shown in FIG. 4. As the light source for excitation 90, a Nd:GdVO4 solid laser is used, and as the external reflecting mirror 80, a dielectric mirror formed with multiple layers of SiO2/TiO2 is used. The thickness of the substrate 11, which is a GaAs substrate, is 100 μm. The substrate 11 is fixed on the heat radiation substrate 70, which is a diamond substrate, via AuSn. The heat radiation substrate 70 can be any substrate formed with a material with higher thermal conductivity than GaAs, including a substrate formed with silicon or copper.

Second Embodiment

Figure 5:
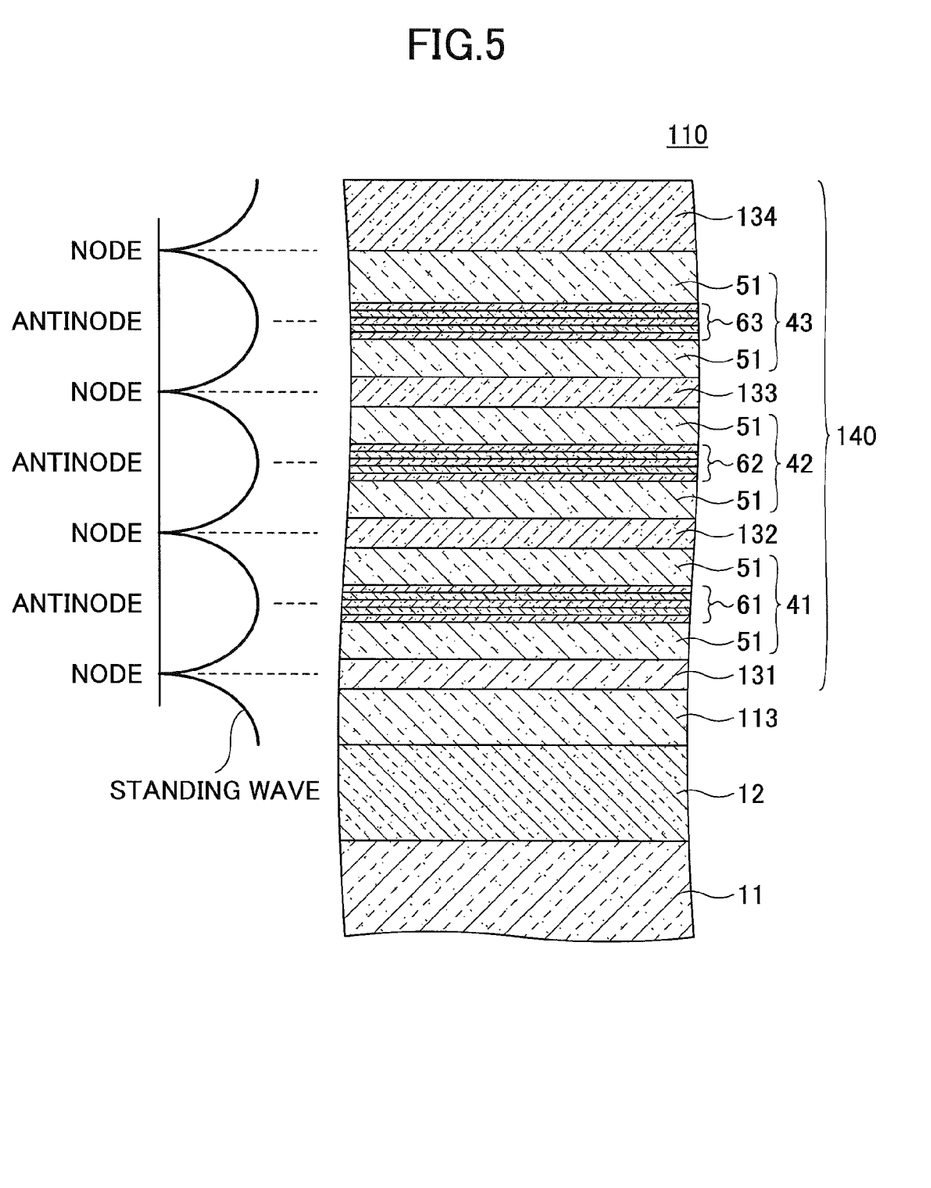
FIG. 5 is a schematic view illustrating a semiconductor stack according to the second embodiment.

Next, a semiconductor stack will be explained according to the second embodiment. As shown in FIG. 5, the semiconductor stack in the present embodiment has a different structure from the one in the first embodiment.

In the present embodiment, in a semiconductor stack 10, a GaAs(100) substrate with 15 degrees off toward ((111) direction) is used as a substrate 11, on which 30 pairs of GaAs/AlAs layers are laminated to form a semiconductor DBR 12.

On the semiconductor DBR 12, a spacer layer 113 is formed with GaAs, on which a first carrier block layer 131, a first active layer 41, a second carrier block layer 132, a second active layer 42, a third carrier block layer 133, a third active layer 43, and a fourth carrier block layer 134 are formed in that order. It is noted that the in the present embodiment, a region formed with the first carrier block layer 131, the first active layer 41, the second carrier block layer 132, the second active layer 42, the third carrier block layer 133, the third active layer 43, and the fourth carrier block layer 134 may be referred to as a resonator layer 140. Also, in the present embodiment, the first carrier block layer 131, the second carrier block layer 132, the third carrier block layer 133, and the fourth carrier block layer 134 may be referred to as the first wide-band semiconductor layer, the second wide-band semiconductor layer, the third wide-band semiconductor layer, and the fourth wide-band semiconductor layer, respectively, counting from the layer closest to the substrate 11.

Each of the first active layer 41, the second active layer 42, and the third active layer 43 has a structure in which a spacer layer, an MQW layer, and a spacer layer are laminated in that order; namely, the spacer layers are formed on both surfaces of the MQW layer. Specifically, the first active layer 41 has a structure in which the spacer layer 51, the MQW layer 61, and the spacer layer 51 are laminated; namely, the spacer layers are formed on both surfaces of the MQW layer. The second active layer 42 has a structure in which the spacer layer 51, the MQW layer 62, and the spacer layer 51 are laminated; namely, the spacer layers are formed on both surfaces of the MOW layer. The third active layer 43 has a structure in which the spacer layer 51, the MQW layer 62, and the spacer layer 51 are laminated; namely, the spacer layers are formed on both surfaces of the MQW layer. The spacer layer 51 is formed with GaAs, and the MQW layers 61 to 63 include GaInAs/GaAs TQW ($\lambda$=980 nm).

Also, in the present embodiment, the first carrier block layer 131, the second carrier block layer 132, the third carrier block layer 133, and the fourth carrier block layer 134 are formed with an AlGaInPAs material, with a different composition ratio for each layer. Specifically, the first carrier block layer 131 is formed with $(Al_{X1}Ga_{1-X1})_{Y1}In_{1-Y1}P$, the second carrier block layer 132 is formed with $(Al_{X2}Ga_{1-X2})_{Y2}In_{1-Y2}P$, the third carrier block layer 133 is formed with $(Al_{X3}Ga_{1-X3})_{Y3}In_{1-Y3}P$, and the fourth carrier block layer 134 is formed with $(Al_{X4}Ga_{1-X4})_{Y4}In_{1-Y4}P$, where X1<X2<X3<X4, and Y1=Y2=Y3=Y4.

In the present embodiment, the first carrier block layer 131, the second carrier block layer 132, the third carrier block layer 133, and the fourth carrier block layer 134 are formed with an AlGaInP material. Therefore, when growing a crystal, at the interface with a GaAs spacer layer, it is necessary to change growth atmosphere from P/As mixed atmosphere to As atmosphere, or from As atmosphere to P/As mixed atmosphere. However, in such cases, As atoms on the surface of GaAs or P atoms on the surface of AlGaInPAs tend to become detached, which generates lattice defects at the interface. The generated lattice defects absorb laser light, which lowers light emission efficiency. To minimize the absorption of laser light as well as the reduction of light emitting efficiency, a region susceptible to lattice defects may be positioned at a node of a standing wave.

In the present embodiment, the first carrier block layer 131, the second carrier block layer 132, and the third carrier block layer 133 are formed so that the center of each of the layers is positioned at a node of the standing wave, to minimize the absorption of laser light. As for the fourth carrier block layer 134, the interface between the fourth carrier block layer 134 and the adjacent spacer layer 51 is positioned at a node of the standing wave, whereas the surface of the fourth carrier block layer 134 is positioned at an antinode of the standing wave to minimize the absorption of laser light caused by lattice defects or the like. Preferably, except for the fourth carrier block layer 134, the thickness of the first carrier block layer 131, the second carrier block layer 132, and the third carrier block layer 133 is below one-eighth of the oscillating wavelength.

The structure according to the present embodiment shown in FIG. 5 has equal intervals between adjacent carrier block layers. When exciting from the surface, carriers are not generated uniformly in the depth direction. More carriers are generated at layers closer to the surface. Therefore, if carrier block layers are formed uniformly, more carriers are injected at MON layers closer to the surface, whereas MQW layers closer to the substrate 11 may not be injected with sufficient carriers to contribute to laser oscillation by an external resonator.

Figure 6:
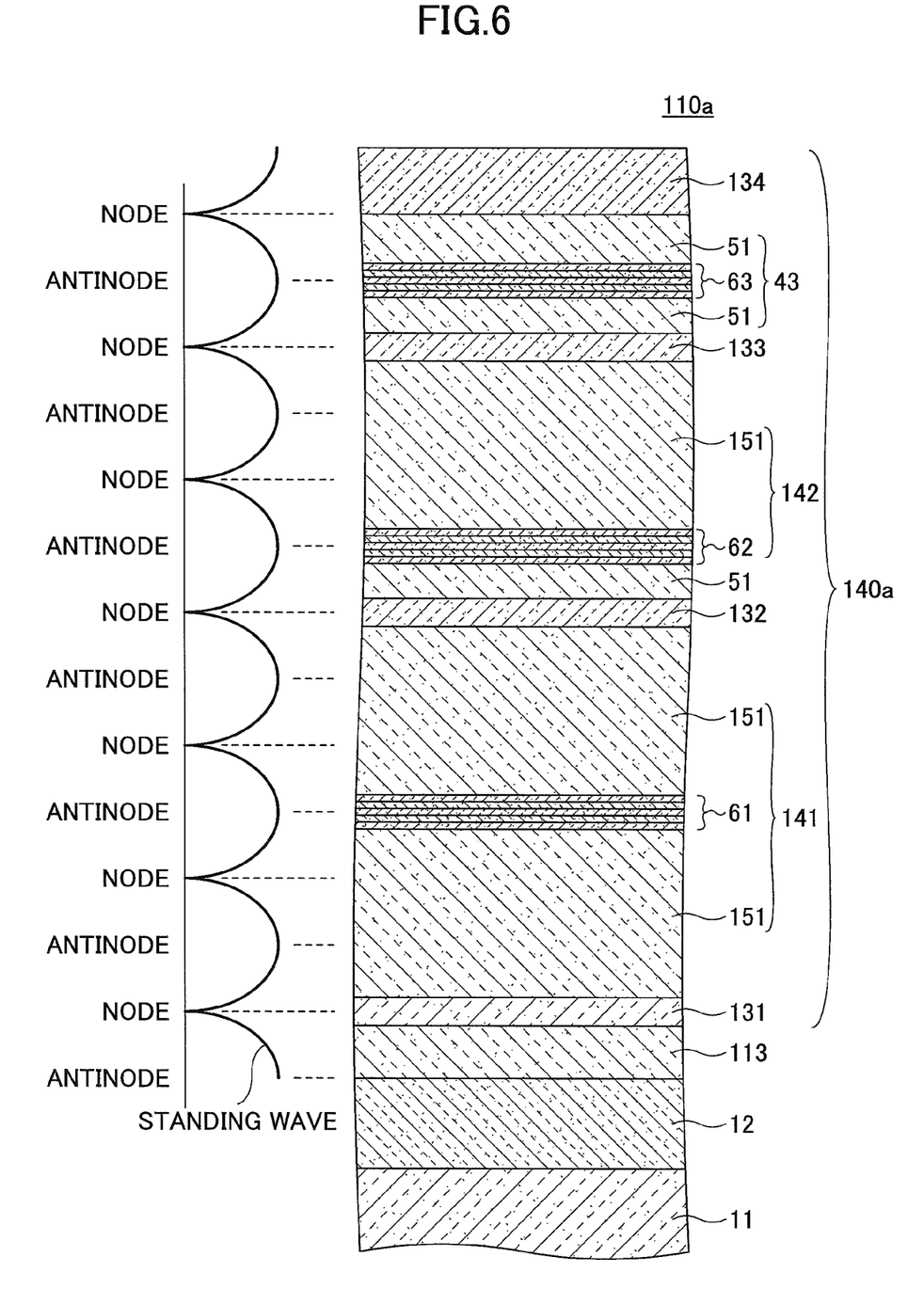
FIG. 6 is a schematic view illustrating another semiconductor stack according to the second embodiment.

Therefore, as shown in FIG. 6, intervals between adjacent carrier block layers closer to the substrate 11 are formed wider than those closer to the surface. Thus, carriers generated between carrier block layers can be increased to inject carriers uniformly into the MQW layers between the surface and the substrate, which enables an efficient laser oscillation.

In a semiconductor stack 110a according to the present embodiment shown in FIG. 6, on top of the substrate 11, 30 pairs of GaAs/AlAs are laminated to form the semiconductor DBR 12. Above the semiconductor DBR 12, the spacer layer 113 is formed with GaAs. On top of the spacer layer 113, the first carrier block layer 131, a first active layer 141, the second carrier block layer 132, a second active layer 142, the third carrier block layer 133, the third active layer 43, and the fourth carrier block layer 134 are formed in that order. It is noted that a region formed with the first carrier block layer 131, the first active layer 141, the second carrier block layer 132, the second active layer 142, the third carrier block layer 133, the third active layer 43, and the fourth carrier block layer 134 may be referred to as a resonator layer 140a.

Each of the first active layer 141, the second active layer 142, and the third active layer 43 has a structure in which a spacer layer, an MQW layer, and a spacer layer are laminated in that order; namely, the spacer layers are formed on both surfaces of the MQW layer.

Specifically, the first active layer 141 has a structure in which the spacer layer 151, the MQW layer 61, and the spacer layer 151 are laminated; namely, the spacer layers 151 are formed on both surfaces of the MQW layer 61. The thickness of the spacer layer 151 are adjusted so that three antinodes of electric field intensity distribution are formed between the first carrier block layer 131 and the second carrier block layer 132. Therefore, the spacer layer 151 is formed thicker than the spacer layer 51.

Also, the second active layer 142 has a structure in which the spacer layer 51, the MQW layer 62, and the spacer layer 151 are laminated; namely, the spacer layer 51 is formed on a surface of the MQW layer 62 and the spacer layer 151 is formed on the other surface of the MOW layer 62. The thickness of the spacer layer 151 is adjusted so that two antinodes of electric field intensity distribution are formed between the second carrier block layer 132 and the third carrier block layer 133.

Also, the third active layer 43 has a structure in which the spacer layer 51, the MQW layer 63, and the spacer layer 51 are laminated; namely, the spacer layers 51 are formed on both surfaces of the MQW layer 63. An antinode of electric field intensity distribution is formed between the third carrier block layer 133 and the fourth carrier block layer 134.

As above, in the structure shown in FIG. 6, layers are formed so that intervals between carrier block layers become thinner when moving from the substrate 11 to the surface. In other words, layers are formed so that intervals between carrier block layers become thicker when moving from the surface to the substrate 11. Namely, the interval between the m−1-th and m-th wide-band semiconductor layers counted from the substrate 11 is formed wider than the interval between the m-th and the m+1-th wide-band semiconductor layers. Also, as shown in FIG. 6, each of the MQW layers does not need to be positioned at the center of two adjacent carrier block layers, but positioned at an antinode of electric field intensity distribution.

Other details are the same as in the first embodiment.

Third Embodiment (Vertical Cavity Surface Emitting Laser Device)

The third embodiment will be described. In the present embodiment, a vertical cavity surface emitting laser device will be described, which uses the semiconductor stack according to the first or second embodiment, with the oscillating wavelength of 980-nm range.

Figure 7:
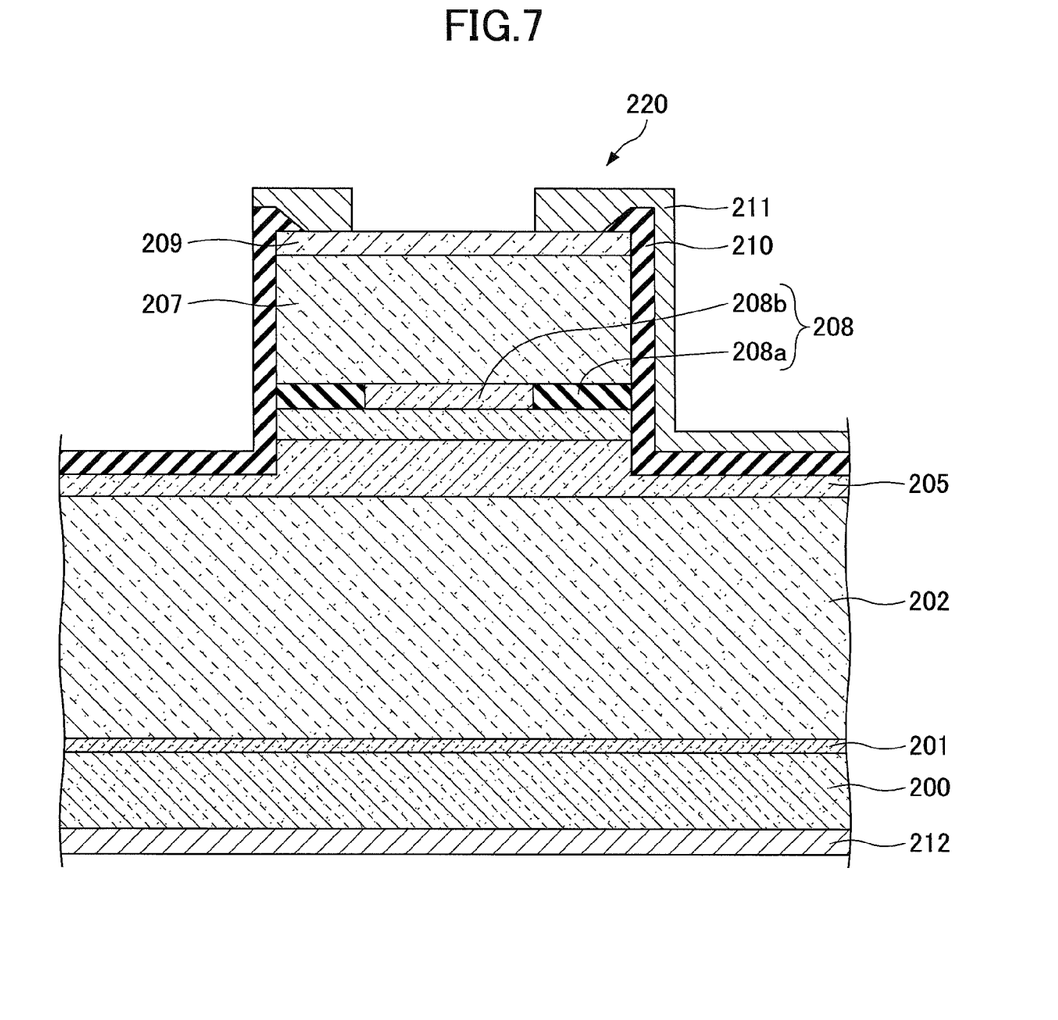
FIG. 7 is a schematic view of a structure of a vertical cavity surface emitting laser according to the third embodiment.

As shown in FIG. 7, the vertical cavity surface emitting laser device in the present embodiment is formed on a type of semiconductor substrate 200, an inclined substrate having the plane direction inclined, on which a buffer layer 201, a lower semiconductor DBR 202, an active layer 205, and an upper semiconductor DBR 207 are formed and laminated. Also, on top of the upper semiconductor DBR 207, a contact layer 209 is formed. By removing parts of the contact layer 209, the upper semiconductor DBR 207, and the active layer 205, a mesa 220 is formed. A current confinement layer 208 is formed in the upper semiconductor DBR 207, which is oxidized from side surfaces of the mesa 220, which has been formed, to form a selectively oxidized region 208a and a non-oxidized region, or a current confinement region 208b. It is noted that the lower semiconductor DBR 202 and the active layer 205 formed on the semiconductor substrate 200 in the present embodiment correspond to the ones formed on the semiconductor stack in the first and other embodiments. The semiconductor substrate 200 in the present embodiment corresponds to the substrate 11 in the first and other embodiments, the lower semiconductor DBR 202 corresponds to the semiconductor DBR 12, and the active layer 205 corresponds to the resonator layer 40.

Additionally, in the present embodiment, a protection film 210 is formed to cover the side surfaces of the mesa 220 and around the bottom of the mesa 220. An upper electrode 211 is formed on the protection film 210, touching the contact layer 209 exposed at the top surface of the mesa 220, while a lower electrode 212 is formed on the reverse side of the semiconductor substrate 200.

Also, the upper semiconductor DBR 207 is formed with, for example, 25 pairs of GaAs/AlAs layers, and in the upper semiconductor DBR 207, the current confinement layer 208, or an AlAs layer is formed. The current confinement layer 208 is formed with the thickness of about 30 nm, at a position of the third node of the standing wave, counted from the active layer 205. The contact layer 209 is formed with p-GaAs. The protection film 210 is formed with, for example, SiN and the like.

(Method of Producing VCSEL Device)

Next, with reference to FIG. 7, a method of producing the vertical cavity surface emitting laser device will be described according to the present embodiment.

First, on top of the semiconductor substrate 200 formed with GaAs, the buffer layer 201, the lower semiconductor DBR 202, the active layer 205, the upper semiconductor DBR 207, and the contact layer 209 are formed and laminated. Here, the current confinement layer 208 is formed in the upper semiconductor DBR 207. MOCVD (Metal Organic Chemical Vapor Deposition) or MBE (Molecular Beam Epitaxy) may be used to form the device. For example, if using MOCVD to form the above layers, trimethyl aluminum (TMA), trimethyl gallium (TMG), and trimethyl indium (TMI) may be used as raw materials for Group 3 elements, phosphine (PH3) and arsine (AsH3) may be used as raw materials for Group 5 elements, carbon tetrabromide (CBr4) and dimethyl zinc (DMZn) may be used as raw materials for p-type dopants, and hydrogen selenide (H2Se) may be used as a raw material for n-type dopant. As mentioned earlier, the lower semiconductor DBR 202 and the active layer 205 formed on the semiconductor substrate 200 in the present embodiment are substantially the same as those in the semiconductor stack in the first and other embodiments, and which can be produced in the same way.

Next, the mesa 220 is formed. Specifically, photoresist is applied on the contact layer 209 to be exposed by an exposure device, which is then developed to form a resist pattern in the region where the mesa 220 is to be formed. After that, by ECR (Electron Cyclotron Resonance) plasma etching using Cl2 gas, a region of the contact layer 209, the upper semiconductor DBR 207, and the active layer 205 where the resist pattern is not formed is removed to form the mesa 220.

Next, heat processing is applied in water vapor. Specifically, the current confinement layer 208, which is exposed on the side surfaces of the mesa 220 when the mesa 220 has been formed, is oxidized from the side surfaces of the mesa 220 to form a selectively oxidized region 208a. A non-selectively oxidized region around the center of the mesa 220 in the current confinement layer 208, or a region surrounded by the selectively oxidized region 208a, becomes a current confinement region 208b, in which current can flow concentratedly.

Next, the protection film 210 is formed on the side surfaces of the mesa 220 and around the bottom of the mesa 220. Specifically, the protection film 210, for example, a SiN film is formed on the surface having the mesa 220 formed using CVD (Chemical Vapor Deposition). After that, a resist pattern is formed with an opening at the top surface of the mesa 220. Then, the region of the protection film 210 on which the resist pattern has not been formed is removed with dry etching such as RIE to expose the contact layer 209. After that, the resist pattern is removed with an organic solvent or the like.

Next, the upper electrode 211, or a p-electrode is formed. Specifically, photoresist is applied on the contact layer 209 and the protection film 210 to be exposed by an exposure device, which is then developed to form a resist pattern with an opening at a region where the upper electrode 211 is to be formed. After that, a multi-layer metallic film of Cr/AuZn/Au is formed with vacuum deposition, which is dipped into an organic solvent to remove the multi-layer metallic film formed on the region where the resist pattern has been formed with lift-off, to form the upper electrode 211 with the remaining multi-layer metallic film. Thus, the upper electrode 211 can be formed to be connected with the contact layer 209 exposed on the top surface of the mesa 220.

Next, the lower electrode 212, or an n-electrode is formed. Specifically, the reverse surface of the semiconductor substrate 200 is polished to have a predetermined thickness of, for example, 100 μm to 300 μm, before forming the lower electrode 212. The lower electrode 212 is formed with multilayer metallic film of AuGe/Ni/Au or Ti/Pt/Au by vacuum deposition. After that, annealing is applied, which makes it possible to make an ohmic contact at the upper electrode 211 and the lower electrode 212.

With the above processes, the vertical cavity surface emitting laser device can be produced according to the present embodiment. According to the present embodiment, the vertical cavity surface emitting laser device emits laser light by current injection, which has high carrier confinement effect, a superior heat radiation characteristic and high gain.

Other details are the same as in the first and second embodiments.

As above, the embodiments of the present invention have been described. Further, the present invention is not limited to these embodiments, but various variations and modifications may be made without departing from the scope of the present invention.

The present application is based on Japanese Priority Application No. 2012-056196 filed on Mar. 13, 2012, and Japanese Priority Application No. 2013-006259 filed on Jan. 17, 2013, with the Japanese Patent Office, the entire contents of which are hereby incorporated by reference.

What is claimed is:

1. A semiconductor stack comprising: a semiconductor DBR (Distributed Bragg Reflector) formed on a substrate; and a resonator formed on the semiconductor DBR, formed by laminating wide-band semiconductor layers and active layers alternately, wherein a band gap of the wide-band semiconductor layers is greater than that of the active layers, wherein each of the active layers includes MQWs (Multiple Quantum Wells) and two spacer layers formed one on each surface of the MQWs, wherein the MQWs are formed by laminating barrier layers and quantum well layers alternately, wherein n layers of the wide-band semiconductor layers are formed, and a band gap $Eg_m$ of an m-th wide-band semiconductor layer counting from the substrate and a band gap $Eg_{m-1}$ of an m−1-th wide-band semiconductor layer counting from the substrate satisfy $Eg_{m-1} < Eg_m$ where n and m are integers greater than or equal to 3, and $1 < m \leq n$, wherein each of a first to an n−1-th wide-band semiconductor layers counting from the substrate has its center positioned at a node of a standing wave, wherein an n-th wide-band semiconductor layer counting from the substrate has one of its surface attached to the active layer positioned at a node of the standing wave, and another of its surface positioned at an antinode of the standing wave.

2. The semiconductor stack as claimed in claim 1, wherein the wide-band semiconductor layers are formed with a material including AlGaInP, an Al composition ratio $X_m$ of the m-th wide-band semiconductor layer and an Al composition ratio $X_{m-1}$ of the m−1-th wide-band semiconductor layer satisfy $X_{m-1} < X_m$.

3. The semiconductor stack as claimed in claim 1, wherein the wide-band semiconductor layers are formed with a material including AlGaInPAs, an Al composition ratio $X_m$ of the m-th wide-band semiconductor layer and an Al composition ratio $X_{m-1}$ of the m−1-th wide-band semiconductor layer satisfy $X_{m-1} < X_m$.

4. The semiconductor stack as claimed in claim 2, wherein the wide-band semiconductor layers have a prescribed composition of In and P if the wide-band semiconductor layers are formed with a material including AlGaInP, whereas the wide-band semiconductor layers have a prescribed composition of In, P and As if the wide-band semiconductor layers are formed with a material including AlGaInPAs.

5. The semiconductor stack as claimed in claim 1, wherein the wide-band semiconductor layers have tensile strain if the quantum well layers have compressive strain, whereas the wide-band semiconductor layers have compressive strain if the quantum well layers have tensile strain.

6. The semiconductor stack as claimed in claim 1, wherein the spacer layers are formed with GaAs.

7. The semiconductor stack as claimed in claim 1, wherein an interval between the m−1-th and m-th wide-band semiconductor layers is wider than an interval between the m-th and m+1-th wide-band semiconductor layers.

8. A vertical cavity surface emitting laser comprising: the semiconductor stack as claimed in claim 1; an external reflecting minor disposed over the resonator; and a light source for excitation from which light with a shorter wavelength than a wavelength of light emitted from the resonator is irradiated to the resonator.

9. A vertical cavity surface emitting laser comprising: the semiconductor stack as claimed in claim 1; and an upper semiconductor DBR formed on the resonator, wherein the semiconductor DBR in the semiconductor stack is a lower semiconductor DBR, wherein laser light is emitted by injecting current into the resonator.

* * * * *